United States Patent
Nagaya et al.

(10) Patent No.: US 12,476,156 B2
(45) Date of Patent: Nov. 18, 2025

(54) SEMICONDUCTOR CHIP AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP); National University Corporation Tokai National Higher Education and Research System, Nagoya (JP)

(72) Inventors: Masatake Nagaya, Nisshin (JP); Hiroki Watanabe, Nisshin (JP); Junji Ohara, Nisshin (JP); Daisuke Kawaguchi, Hamamatsu (JP); Keisuke Hara, Hamamatsu (JP); Chiaki Sasaoka, Nagoya (JP); Jun Kojima, Nagoya (JP); Shoichi Onda, Nagoya (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP); National University Corporation Tokai National Higher Education and Research System, Nagoya (JP)

( * ) Notice: Subject to any disclaimer, the term of this patent is extended or adjusted under 35 U.S.C. 154(b) by 606 days.

(21) Appl. No.: 17/948,329

(22) Filed: Sep. 20, 2022

(65) Prior Publication Data
US 2023/0116302 A1    Apr. 13, 2023

(30) Foreign Application Priority Data
Oct. 8, 2021    (JP) .................... 2021-166151

(51) Int. Cl.
*H01L 23/14* (2006.01)
*H01L 23/13* (2006.01)
*H10D 84/05* (2025.01)

(52) U.S. Cl.
CPC ............ *H01L 23/147* (2013.01); *H01L 23/13* (2013.01); *H10D 84/05* (2025.01)

(58) Field of Classification Search
CPC ... H01L 23/147; H01L 21/8252; H01L 23/13; H01L 2221/68322; H01L 2221/68327;
(Continued)

(56) References Cited

U.S. PATENT DOCUMENTS 4,859,253 A * 8/1989 Buchanan ........... H01L 21/0217
  438/606
7,869,482 B2 * 1/2011 Kubota ............... H01S 5/34333
  372/2

(Continued)

FOREIGN PATENT DOCUMENTS

JP    H09186404 A    7/1997
JP    2019-126838 A    8/2019

*Primary Examiner* — Vu A Vu
(74) *Attorney, Agent, or Firm* — POSZ LAW GROUP, PLC

(57) ABSTRACT

A semiconductor chip includes a chip-constituting substrate having one surface, the other surface opposite to the one surface, and two pairs of opposing side surfaces connecting the one surface and the other surface. The one surface and the other surface are along one of a {0001} c-plane, a {1-100} m-plane, and a {11-20} a-plane. One of the two pairs of opposing side surfaces is along another one of the {0001} c-plane, the {1-100} m-plane, and the {11-20} a-plane. The other of the two pairs of opposing side surfaces is along the other of the {0001} c-plane, the {1-100} m-plane, and the {11-20} a-plane. The side surface includes an altered layer containing gallium oxide and gallium metal (Continued)

in a surface layer portion in a depth direction which is a normal direction to the side surface.

4 Claims, 8 Drawing Sheets

(58) Field of Classification Search
CPC ....... H01L 2221/68354; H01L 21/6835; H01L 21/78; H01L 21/7813; H01L 29/2003; H01L 33/44; H01L 33/0075; H01L 33/0095; H01L 33/0093
USPC ........................................................ 257/615
See application file for complete search history.

(56) References Cited

U.S. PATENT DOCUMENTS

| | | | |
|---|---|---|---|
| 8,513,684 B2* | 8/2013 | Kyono | .................... H01L 33/16 257/94 |
| 8,953,656 B2* | 2/2015 | Kyono | ................ H01S 5/34333 372/49.01 |
| 9,231,375 B2* | 1/2016 | Tasai | ...................... B82Y 20/00 |
| 2005/0202596 A1 | 9/2005 | Fukuyo et al. | |
| 2006/0011593 A1 | 1/2006 | Fukuyo et al. | |
| 2007/0063215 A1 | 3/2007 | Kohda | |
| 2007/0158314 A1 | 7/2007 | Fukumitsu et al. | |
| 2010/0015783 A1 | 1/2010 | Fukuyo et al. | |
| 2012/0205358 A1 | 8/2012 | Fukuyo et al. | |
| 2013/0105762 A1* | 5/2013 | Kyono | .................... H01L 33/16 257/E33.025 |
| 2013/0252402 A1 | 9/2013 | Fukuyo et al. | |
| 2013/0344686 A1 | 12/2013 | Fukuyo et al. | |
| 2014/0080288 A1 | 3/2014 | Fukuyo et al. | |
| 2019/0081205 A1 | 3/2019 | Totani | |
| 2021/0234007 A1 | 7/2021 | Ueno et al. | |
| 2021/0327757 A1 | 10/2021 | Nagaya et al. | |
| 2022/0052220 A1* | 2/2022 | Lai | ...................... H01L 31/0445 |

* cited by examiner

SEMICONDUCTOR CHIP AND METHOD FOR MANUFACTURING THE SAME

CROSS REFERENCE TO RELATED APPLICATION

This application is based on Japanese Patent Application No. 2021-166151 filed on Oct. 8, 2021, the disclosure of which is incorporated herein by reference in its entirety.

TECHNICAL FIELD

The present disclosure relates to a semiconductor chip provided with a chip-constituting substrate containing gallium nitride (hereinafter also simply referred to as GaN) and a method of manufacturing the same.

BACKGROUND

Conventionally, a method of manufacturing semiconductor chips by dividing a processed wafer into chip units has been proposed.

SUMMARY

According to an aspect of the present disclosure, a semiconductor chip includes: a chip-constituting substrate having one surface, the other surface opposite to the one surface, and two pairs of opposing side surfaces connecting the one surface and the other surface. The chip-constituting substrate contains a hexagonal gallium nitride. The one surface and the other surface are along one of a {0001} c-plane, a {1-100} m-plane, and a {11-20} a-plane. One of the two pairs of opposing side surfaces is along another one of the {0001} c-plane, the {1-100} m-plane, and the {11-20} a-plane. The other of the two pairs of opposing side surfaces is along the other of the {0001} c-plane, the {1-100} m-plane, and the {11-20} a-plane. The side surface includes an altered layer containing gallium oxide and gallium metal on a surface layer portion in a depth direction which is a normal direction to the side surface.

DETAILED DESCRIPTION

Figure 1A:
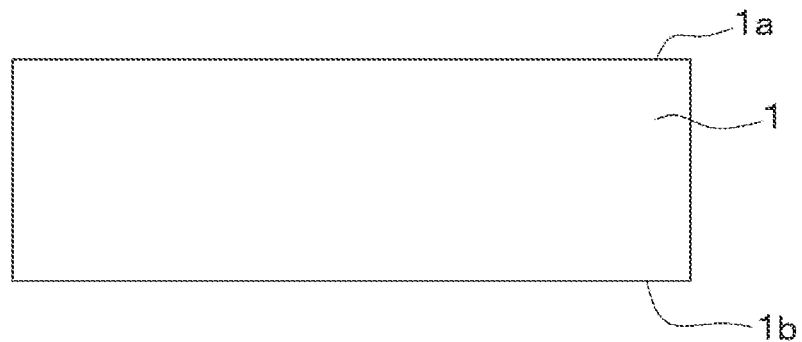
FIG. 1A is a cross-sectional view showing a manufacturing process of a semiconductor chip according to a first embodiment.

To begin with, examples of relevant techniques will be described.

Conventionally, a method of manufacturing semiconductor chips by dividing a processed wafer into chip units has been proposed. Specifically, in this manufacturing method, a processed wafer is prepared, which contains gallium oxide and has plural chip forming regions defined by dicing lines. In this manufacturing method, the semiconductor chips are manufactured by irradiating the dicing line with a laser beam to form an altered layer and then cutting the processed wafer along the dicing line with a dicing blade to divide into the chip units.

The present inventors consider manufacturing semiconductor chips using a processed wafer containing GaN, which has advantages such as a wide bandgap and a high electron saturation velocity. According to the studies by the present inventors, when such a processed wafer is divided into chips, cracks may occur inward from the side surface, or excessive strain may occur on the side surface.

The present disclosure provides a semiconductor chip and a method of manufacturing the same, so as to suppress the generation of cracks and excessive strain on the side surface.

According to an aspect of the present disclosure, a semiconductor chip includes: a chip-constituting substrate having one surface, the other surface opposite to the one surface, and two pairs of opposing side surfaces connecting the one surface and the other surface. The chip-constituting substrate contains a hexagonal gallium nitride. The one surface and the other surface are along one of a {0001} c-plane, a {1-100} m-plane, and a {11-20} a-plane. One of the two pairs of opposing side surfaces is along another one of the {0001} c-plane, the {1-100} m-plane, and the {11-20} a-plane. The other of the two pairs of opposing side surfaces is along the other of the {0001} c-plane, the {1-100} m-plane, and the {11-20} a-plane. The side surface includes an altered layer containing gallium oxide and gallium metal on a surface layer portion in a depth direction which is a normal direction to the side surface.

Accordingly, the side surface of the semiconductor chip is easily cleaved. Therefore, when the semiconductor chips are separated from the processed wafer, it is possible to suppress the occurrence of cracks and excessive strain on the side surface. In the semiconductor chip, the surface layer portion of the side surface includes the altered layer containing the gallium oxide. Therefore, it is possible to improve the insulation of the side surface.

According to another aspect of the present disclosure, a method for manufacturing the semiconductor chip includes: preparing a processed wafer having one surface and the other surface and containing the hexagonal gallium nitride, the processed wafer having plural chip formation areas defined by a cutting line; irradiating the processed wafer with a laser beam to form a chip transformation layer in which nitrogen is separated from gallium along the cutting line; and dividing the chip formation areas from each other with the chip transformation layer as a boundary, so as to form the chip-constituting substrate having one surface composed of the one surface of the processed wafer, the other surface composed of the other surface of the processed wafer, and the two pairs of opposing side surfaces along the cutting line so as to connect the one surface and the other surface.

Accordingly, the semiconductor chip having the side surface that is easily cleaved is manufactured. Therefore, when the semiconductor chips are separated from the processed wafer, it is possible to suppress the occurrence of cracks extending inward on the side surface and the occurrence of excessive strain on the side surface. In the semiconductor chip, the surface layer portion of the side surface includes the altered layer containing the gallium oxide. Therefore, it is possible to improve the insulation of the side surface.

A reference numeral attached to each component or the like indicates an example of correspondence between the component or the like and specific component or the like described in embodiments below.

Hereinafter, embodiments of the present disclosure will be described with reference to the drawings. In the following embodiments, the same or equivalent parts are denoted by the same reference signs.

First Embodiment

A first embodiment will be described with reference to the drawings. A method of manufacturing a semiconductor chip 100 in which a semiconductor element is formed on a chip-constituting substrate 110 containing GaN will be described below. In the following, when indicating the crystal orientation, a bar (−) should be attached above the desired number, but since there are restrictions on expression based on electronic filing, the desired numbers are preceded by a bar.

First, as shown in FIG. 1A, a GaN wafer 1 having one surface 1a and the other surface 1b and having a bulk wafer shape is prepared. For example, as the GaN wafer 1, a wafer in which silicon, oxygen, germanium or the like is doped and the impurity concentration is $5 \times 10^{17}$ cm$^{-3}$ to $5 \times 10^{19}$ cm$^{-3}$ is used. The thickness of the GaN wafer 1 may be arbitrary, for example, a wafer having a thickness of about 400 μm is prepared.

The GaN wafer 1 of this embodiment is composed of a hexagonal crystal, and the one surface 1a and the other surface 1b are {0001} c-plane. In the GaN wafer 1 of this embodiment, the one surface 1a is (0001) Ga surface and the other surface 1b is (000-1) N surface. Further, the GaN wafer 1 is prepared by recycling a recycled wafer 40 of FIG. 1J, which will be described later, after the manufacturing process of the semiconductor chip 100 described below is performed. If necessary, a protection film made of an oxide film or the like may be formed on the other surface 1b of the GaN wafer 1.

Figure 1B:
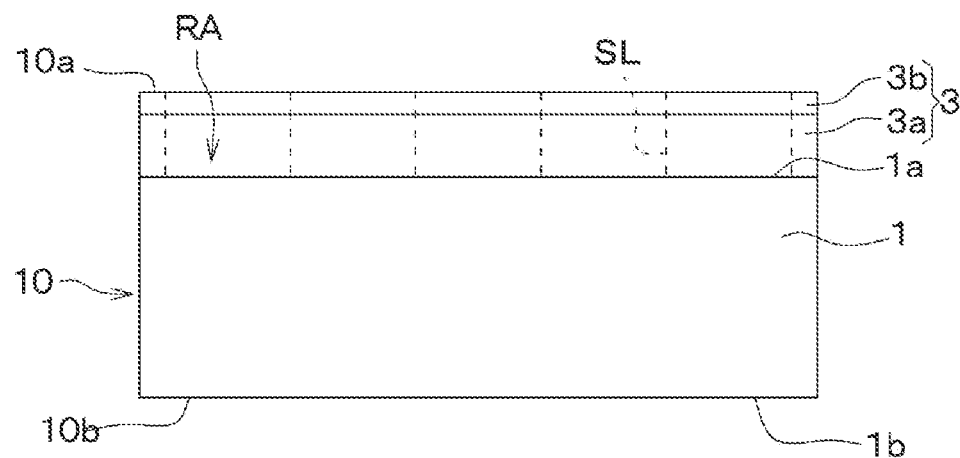
FIG. 1B is a cross-sectional view illustrating a manufacturing process of the semiconductor chip subsequent to FIG. 1A.

Next, as shown in FIG. 1B, an epitaxial film 3 made of GaN with a thickness of about 10 to 60 μm is formed on the one surface 1a of the GaN wafer 1. Thus, a processed wafer 10 is prepared, in which plural chip formation areas RA are partitioned by a cutting line SL. In the present embodiment, the epitaxial film 3 is formed by depositing an n+ type epitaxial layer 3a and an n− type epitaxial layer 3b in order on the GaN wafer 1. For example, the n+ type epitaxial layer 3a is doped with silicon, oxygen, germanium, etc., and has the impurity concentration of about $5 \times 10^{17}$ cm$^{-3}$ to $1 \times 10^{18}$ cm$^{-3}$. The n− type epitaxial layer 3b is doped with silicon or the like, and the impurity concentration is about $1 \times 10^{17}$ cm$^{-3}$ to $4 \times 10^{17}$ cm$^{-3}$.

A one surface side element component 11 such as diffusion layer 12, which will be described later, is formed in the n− type epitaxial layer 3b having a thickness of, for example, about 8 μm to 10 μm. The n+ type epitaxial layer 3a is for securing the thickness of the semiconductor chip 100 described later, and has the thickness of, for example, about 40 μm to 50 μm. The thickness of the n+ type epitaxial layer 3a and the thickness of the n− type epitaxial layer 3b may be arbitrary, for example, the n+ type epitaxial layer 3a is thicker than the n− type epitaxial layer 3b so as to secure the thickness of the semiconductor chip 100.

In the following, a surface of the processed wafer 10 having the epitaxial film 3 is referred to as one surface 10a of the processed wafer 10, and the other surface of the processed wafer 10 adjacent to the GaN wafer 1 is referred to as the other surface 10b of the processed wafer 10. Further, as described above, the GaN wafer 1 is composed of a hexagonal crystal. The epitaxial film 3 is formed on the one surface 1a of the GaN wafer 1, and the other surface 10b of the processed wafer 10 is composed of the other surface 1b of the GaN wafer 1. Therefore, the processed wafer 10 is composed of a hexagonal crystal, and the one surface 10a and the other surface 10b are {0001} c-plane. Each chip formation area RA is disposed adjacent to the one surface 10a of the processed wafer 10.

Figure 1C:
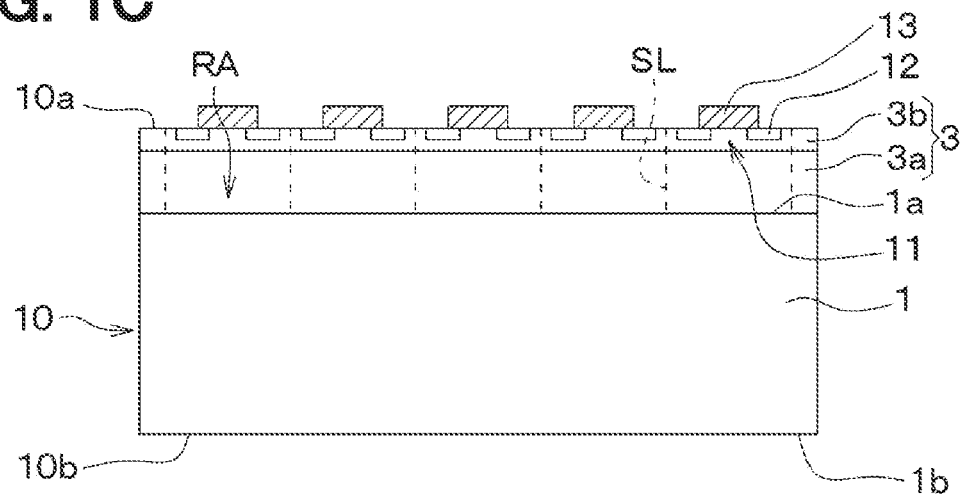
FIG. 1C is a cross-sectional view illustrating a manufacturing process of the semiconductor chip subsequent to FIG. 1B.

Next, as shown in FIG. 1C, a general semiconductor manufacturing process is performed to form the one surface side element component 11 of the semiconductor element such as the diffusion layer 12, a gate electrode 13, a surface electrode, a wiring pattern and a passivation film (which are not shown) in each chip formation area RA. As the semiconductor element, those having various configurations are adopted, for example, a power device such as a high electron mobility transistor (HEMT) and an optical semiconductor element such as a light emitting diode are adopted. After that, if necessary, a surface protection film made of a resist or the like is formed on the one surface 10a of the processed wafer 10.

Figure 1D:
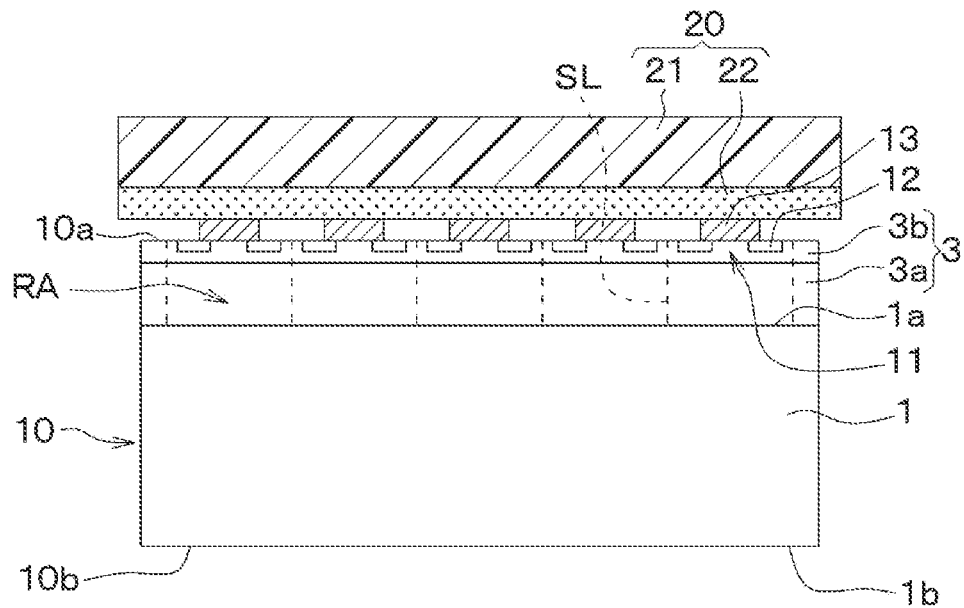
FIG. 1D is a cross-sectional view illustrating a manufacturing process of the semiconductor chip subsequent to FIG. 1C.

Subsequently, as shown in FIG. 1D, a holding member 20 is arranged on the one surface 10a of the processed wafer 10. As the holding member 20, for example, a dicing tape or the like having a base material 21 and an adhesive 22 is used. The base material 21 is made of a material that does not easily warp during the manufacturing process, and is made of, for example, glass, a silicon substrate, ceramics, or the like. The adhesive 22 is made of a material whose adhesive strength can be changed. For example, an adhesive whose adhesive strength changes depending on temperature or light is used. In this case, the adhesive 22 is made of, for example, an ultraviolet curable resin, wax, double-sided tape, or the like. The adhesive 22 is made of a material that maintains the adhesive force even when the other surface side element component 60 of FIG. 1H, which will be described later, is formed.

Figure 1E:
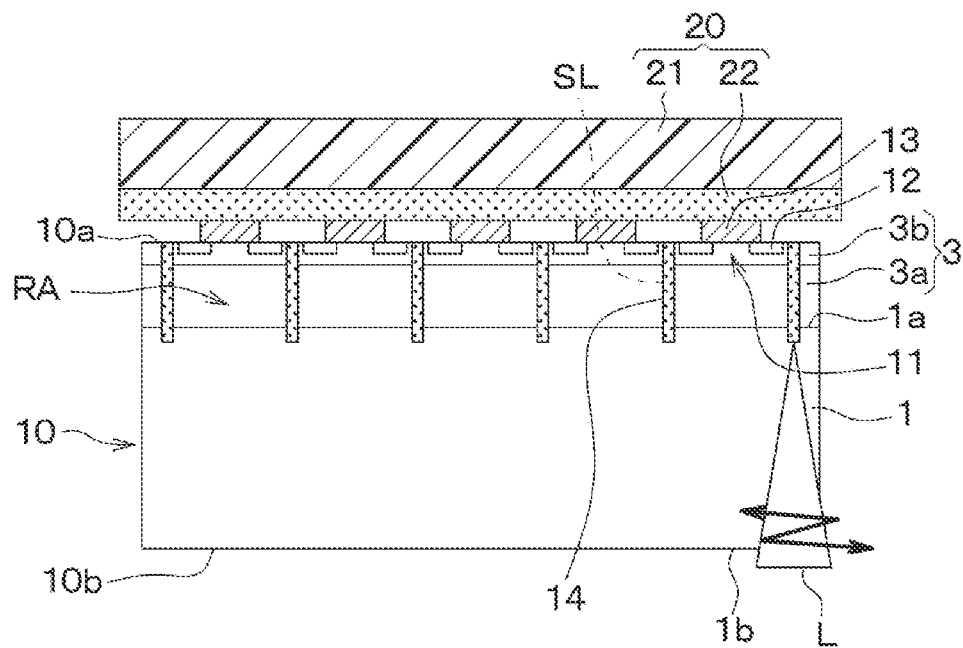
FIG. 1E is a cross-sectional view illustrating a manufacturing process of the semiconductor chip subsequent to FIG. 1D.
Figure 2:
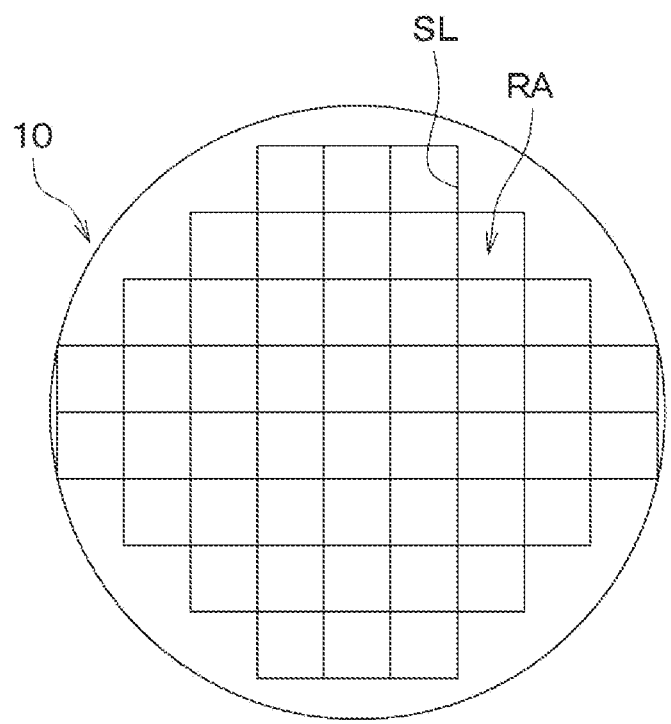
FIG. 2 is a schematic view of a processed wafer.

Next, as shown in FIG. 1E, the other surface 10b of the processed wafer 10 is irradiated with a laser beam L to form a chip transformation layer 14 along the cutting line SL. In the present embodiment, as shown in FIG. 2, each chip formation area RA surrounded by the cutting lines SL has a rectangular planar shape. Further, in the present embodiment, each chip formation area RA is adjusted so that the planes divided into chip units are {1-100} m-plane or {11-20} a-plane. That is, the cutting line SL is adjusted to extend along the {1-100} m-plane or the {11-20} a-plane. Therefore, the chip transformation layer 14 is formed to extend along the {1-100} m-plane or the {11-20} a-plane. In other words, the chip transformation layer 14 is formed along a plane of the hexagonal crystal that is easily cleaved.

In this embodiment, in this step, a laser device is prepared. The laser device has a laser light source that oscillates the laser beam L, a dichroic mirror arranged so as to change the direction of the optical axis (that is, the optical path) of the laser beam, a condensing lens (that is, a condensing optical system) for condensing the laser beam, a displaceable stage, and the like. When forming the chip transformation layer 14, the processed wafer 10 is placed on the stage, and the position of the stage is adjusted so that the focal point of the laser light L is relatively scanned along the cutting line SL.

As a result, the chip transformation layer 14, in which GaN is decomposed to gallium and nitrogen by thermal energy, is formed along the cutting line SL. More specifically, by irradiating the laser beam L, the chip transformation layer 14 is formed in which the gallium is deposited while the nitrogen evaporates as a gas. The chip transformation layer 14 is in a state in which fine pores are formed by discharging the nitrogen.

Further, in the present embodiment, the stage is moved as appropriate when forming the chip transformation layer 14, and the laser light L is irradiated so that the focal point is moved to two or more different locations in the thickness direction of the processed wafer 10. In this case, the chip transformation layers 14 are formed at different locations in the thickness direction of the processed wafer 10, but the chip transformation layers 14 may be separated from each other or may be connected to each other. Further, when the condensing point is moved to two or more different locations in the thickness direction of the processed wafer 10, the condensing point is moved from the one surface 10a of the processed wafer 10 toward the other surface 10b.

In the chip transformation layer 14, when the wafer transformation layer 15 shown in FIG. 1F, which will be described later, is formed, nitrogen generated by forming the wafer transformation layer 15 is discharged to the outside through the pores of the chip transformation layer 14. Further, although not particularly limited, in the present embodiment, when forming the chip transformation layer 14, a solid-state laser beam having a wavelength of 532 nm of a green color laser beam is used as the laser beam L. The laser beam L is irradiated with a processing point output of 2 μJ, a pulse width of 500 ps, and a processing speed of 500 mm/s. Here, these conditions are only one example, and the present inventors confirm that the chip transformation layer 14 can be formed appropriately even when the processing point output of the laser beam L is further lower or the pulse width is further shorter. Further, the present inventors confirm that the chip transformation layer 14 is appropriately formed even when the processing point output of the laser beam L is higher or the pulse width is longer.

Figure 1F:
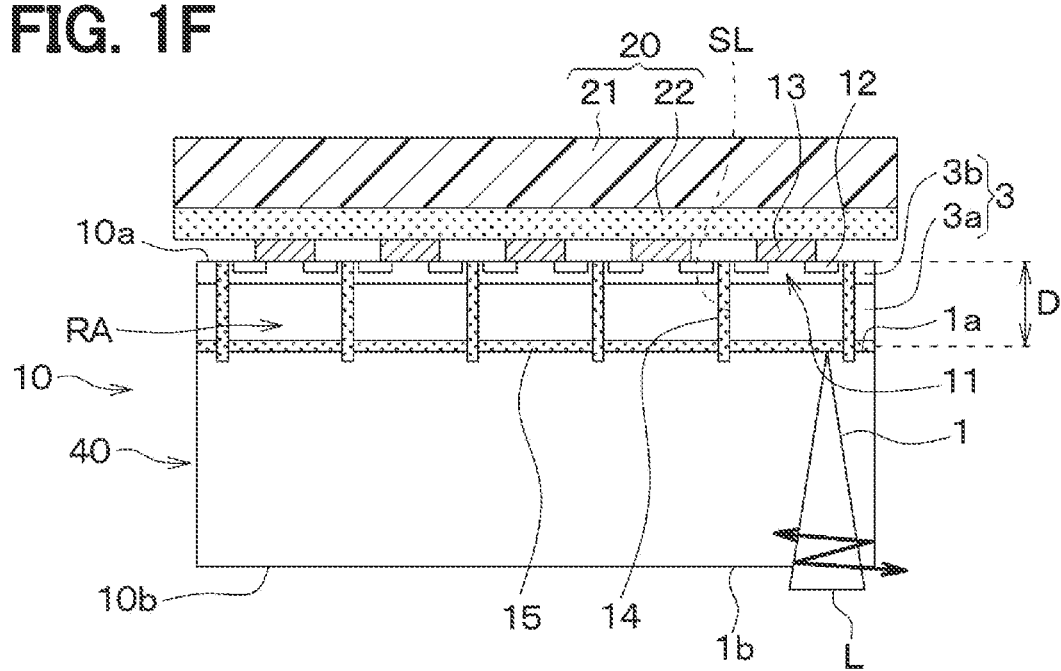
FIG. 1F is a cross-sectional view illustrating a manufacturing process of the semiconductor chip subsequent to FIG. 1E.

Subsequently, as shown in FIG. 1F, the laser beam L is irradiated from the other surface 10b of the processed wafer 10, and the wafer transformation layer 15 is formed at a position with a predetermined depth D from the one surface 10a of the processed wafer 10 along the surface direction of the processed wafer 10. In the present embodiment, the wafer transformation layer 15 is formed by using the laser apparatus used for forming the chip transformation layer 14.

Then, when the wafer transformation layer 15 is formed, the position of the stage is adjusted so that the condensing point of the laser beam L is relatively scanned along the surface direction of the processed wafer 10. As a result, the wafer transformation layer 15 is formed on the processed wafer 10 along the surface direction. The wafer transformation layer 15 has a configuration in which nitrogen evaporates as a gas and gallium is precipitated, similarly to the chip transformation layer 14.

In this case, in the present embodiment, the wafer transformation layer 15 is formed so as to intersect the chip transformation layer 14 or pass directly under the chip transformation layer 14. Thereby, in the present embodiment, it is possible to suppress the application of a large distortion to each chip formation area RA when the wafer transformation layer 15 is formed.

Figure 3A:
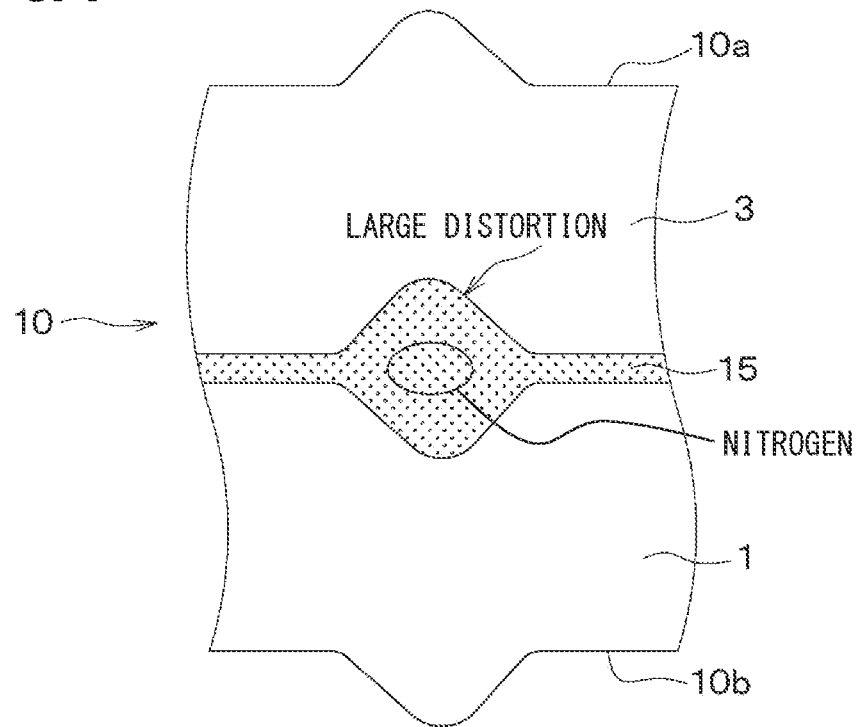
FIG. 3A is a schematic view showing a case where a wafer transformation layer is formed without forming a chip transformation layer.
Figure 3B:
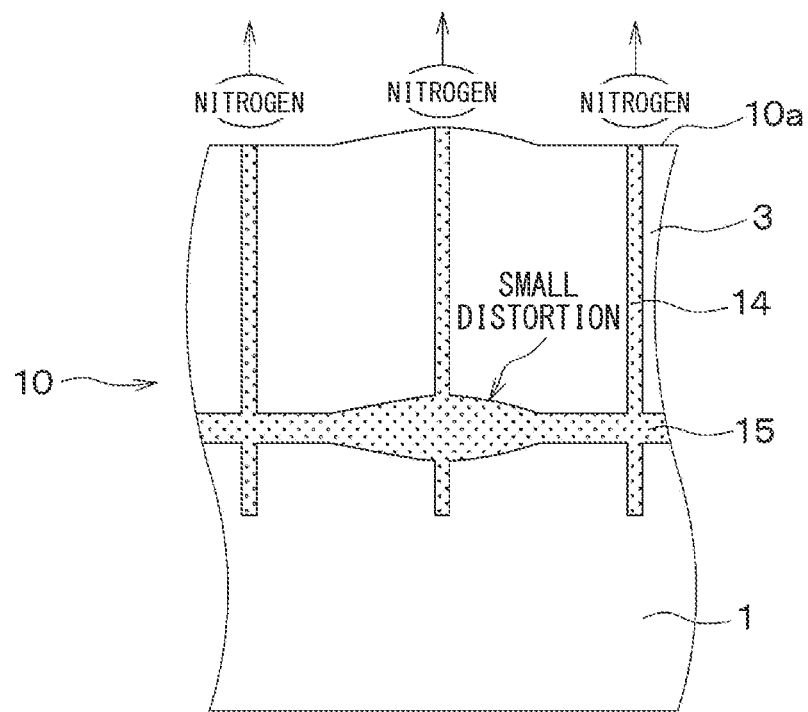
FIG. 3B is a schematic view showing a case where a wafer transformation layer is formed after the chip transformation layer is formed.

That is, when the chip transformation layer 14 is not formed, as shown in FIG. 3A, the nitrogen generated when the wafer transformation layer 15 is formed is difficult to be released to the outside, so that the distortion of the processed wafer 10 due to the formation of the wafer transformation layer 15 tends to increase. In contrast, according to the present embodiment, the chip transformation layer 14 is formed, and the wafer transformation layer 15 is formed so as to intersect the chip transformation layer 14 or pass directly under the chip transformation layer 14. Therefore, as shown in FIG. 3B, nitrogen generated when the wafer transformation layer 15 is formed is easily released to the outside through the pores of the chip transformation layer 14. Therefore, it is possible to suppress an increase in the strain of the processed wafer 10 due to the formation of the wafer transformation layer 15, and it is possible to reduce the strain applied to each chip formation area RA.

Further, although not particularly limited, in the present embodiment, when forming the wafer transformation layer 15, a solid-state laser beam having a wavelength of 532 nm of a green color laser beam is used as the laser beam L. The laser beam L is irradiated with a processing point output of 0.1 μJ to 0.3 μJ, a pulse width of 500 ps, and a processing speed of 50 mm/s to 500 mm/s. These conditions are only one example, and the present inventors confirm that the wafer transformation layer 15 can be formed appropriately even when the processing point output of the laser beam L is further lower or the pulse width is further shorter. Further, the present inventors confirm that the wafer transformation layer 15 is appropriately formed even when the processing point output of the laser beam L is higher or the pulse width is longer.

Further, the predetermined depth D when forming the wafer transformation layer 15 is set according to the ease of handling of the semiconductor chip 100, the withstand pressure, and the like, and is about 10 μm to 200 μm. In this case, the location of the wafer transformation layer 15 is changed according to the thickness of the epitaxial film 3. The wafer transformation layer 15 is formed at least in the epitaxial film 3, at the boundary between the epitaxial film 3 and the GaN wafer 1, or in the GaN wafer 1. Note that FIG. 1F shows an example in which the wafer transformation layer 15 is formed at the boundary between the epitaxial film 3 and the GaN wafer 1.

As will be described later, at least a part of the GaN wafer 1 in the processed wafer 10 is recycled as the recycled wafer 40. Therefore, the wafer transformation layer 15 may be preferably formed inside the epitaxial film 3 or at the boundary between the epitaxial film 3 and the GaN wafer 1. When the wafer transformation layer 15 is formed inside the GaN wafer 1, the wafer transformation layer 15 may be preferably formed adjacent to the one surface 1a of the GaN wafer 1.

When the wafer transformation layer 15 is formed inside the epitaxial film 3, the wafer transformation layer 15 is formed inside the n+ type epitaxial layer 3a instead of the n⁻ type epitaxial layer 3b constituting the semiconductor element. In the following description, a part of the processed wafer 10 between the other surface 10b and the wafer transformation layer 15 is referred to as the recycled wafer 40.

Figure 1G:
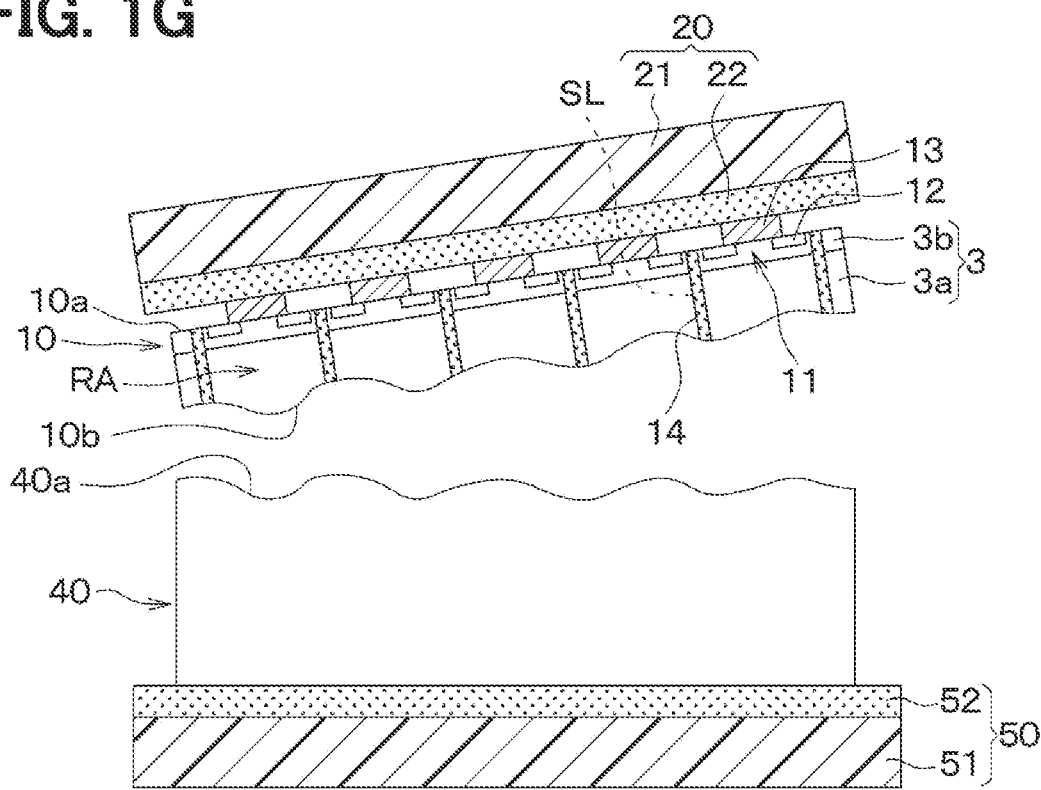
FIG. 1G is a cross-sectional view illustrating a manufacturing process of the semiconductor chip subsequent to FIG. 1F.

Next, as shown in FIG. 1G, the auxiliary member 50 is arranged on the other surface 10b of the processed wafer 10. As with the holding member 20, the auxiliary member 50 is, for example, a dicing tape having the base material 51 and the adhesive 52. The base material 51 is made of, for example, glass, a silicon substrate, ceramics, or the like. The adhesive 52 is composed of, for example, ultraviolet curable resin, wax, double-sided tape, or the like. The holding member 20 and the auxiliary member 50 are held and a tensile force is applied in the thickness direction of processed wafer 10, such that the processed wafer 10 is separated from recycled wafer 40 with the wafer transformation layer 15 as a boundary (that is, starting point of branching).

In the following steps, the surface of the processed wafer 10 separated from the recycled wafer 40 is defined as the other surface 10b of the processed wafer 10. Since the wafer transformation layer 15 is formed along the surface direction of the processed wafer 10, the other surface 10b of the divided processed wafer 10 is {0001} c-plane. In the following, the divided surface of the recycled wafer 40 is referred to as one surface 40a. In each figure after FIG. 1G, the wafer transformation layer 15 and the like remaining on the other surface 10b of the processed wafer 10 and the one surface 40a of the recycled wafer 40 are omitted as appropriate.

Figure 1H:
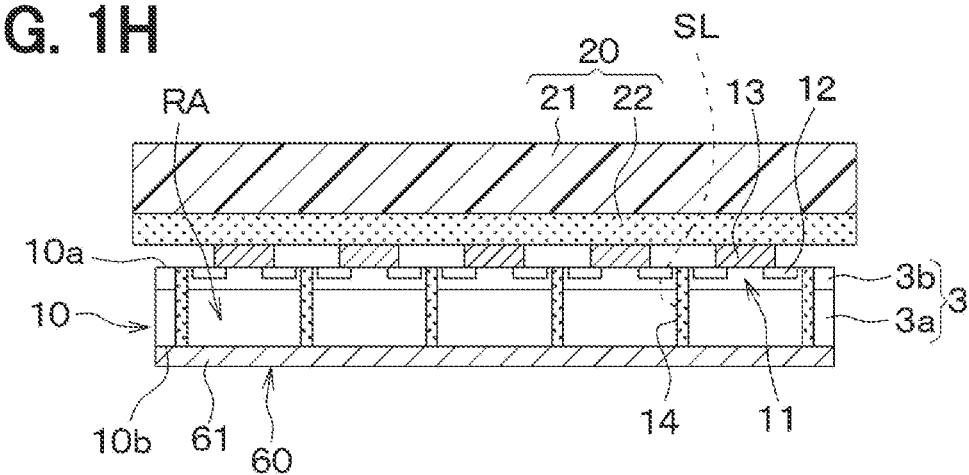
FIG. 1H is a cross-sectional view illustrating a manufacturing process of the semiconductor device subsequent to FIG. 1G.

After that, as shown in FIG. 1H, a general semiconductor manufacturing process is performed, and a step is performed for forming the other surface side element component 60 of the semiconductor element such as the metal film 61 constituting the back surface electrode is formed on the other surface 10b of the processed wafer 10.

Before the step of forming the other surface side element component 60, a step of flattening the other surface 10b of the processed wafer 10 by a CMP (abbreviation of chemical mechanical polishing) method or the like may be performed as necessary. FIG. 1H shows a diagram in which the other surface 10b of the processed wafer 10 is flattened. Further, after performing the step of forming the other surface side element component 60, heat treatment such as laser annealing or the like may be performed in order to make ohmic contact between the metal film 61 and the other surface 10b of the processed wafer 10 as necessary.

Figure 1I:
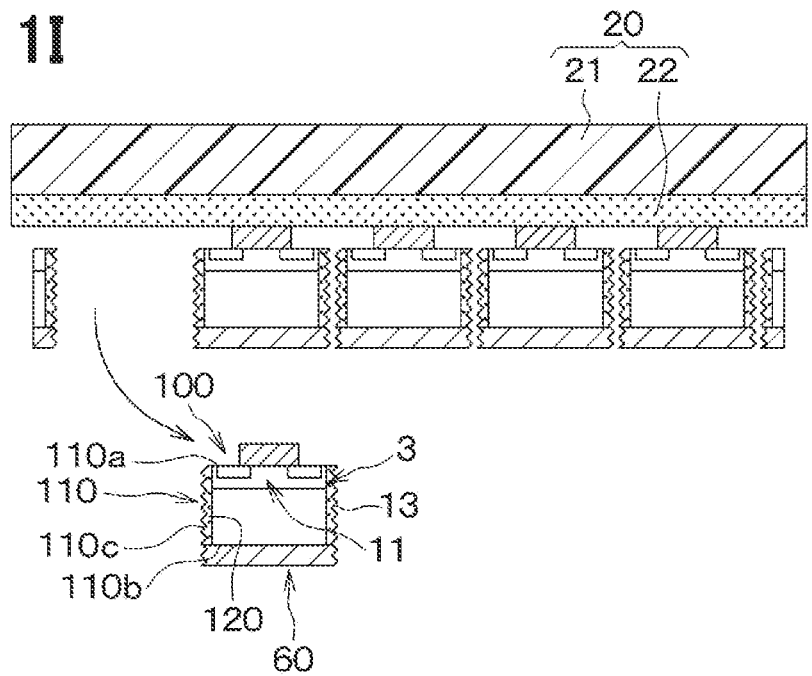
FIG. 1I is a cross-sectional view illustrating a manufacturing process of the semiconductor chip subsequent to FIG. 1H.

Subsequently, as shown in FIG. 1I, the holding member 20 is expanded, and the chip formation areas RA are divided from each other at the chip transformation layer 14 as a boundary (that is, the starting point of branching). As a result, the semiconductor chip 100 having the chip-constituting substrate 110 is constructed from the processed wafer 10. The chip-constituting substrate 110 has the one surface 110a composed of the one surface 10a of the processed wafer 10, the other surface 110b composed of the other surface 10b of the processed wafer 10, and the side surface 110c composed of the cutting line SL. In other words, the semiconductor chip 100 is constituted by the rectangular parallelepiped chip-constituting substrate 110 having the one surface 110a, the other surface 110b opposite to the one surface 110a, and the two pairs of opposing side surfaces 110c connecting the one surface 110a and the other surface 110b.

Figure 4:
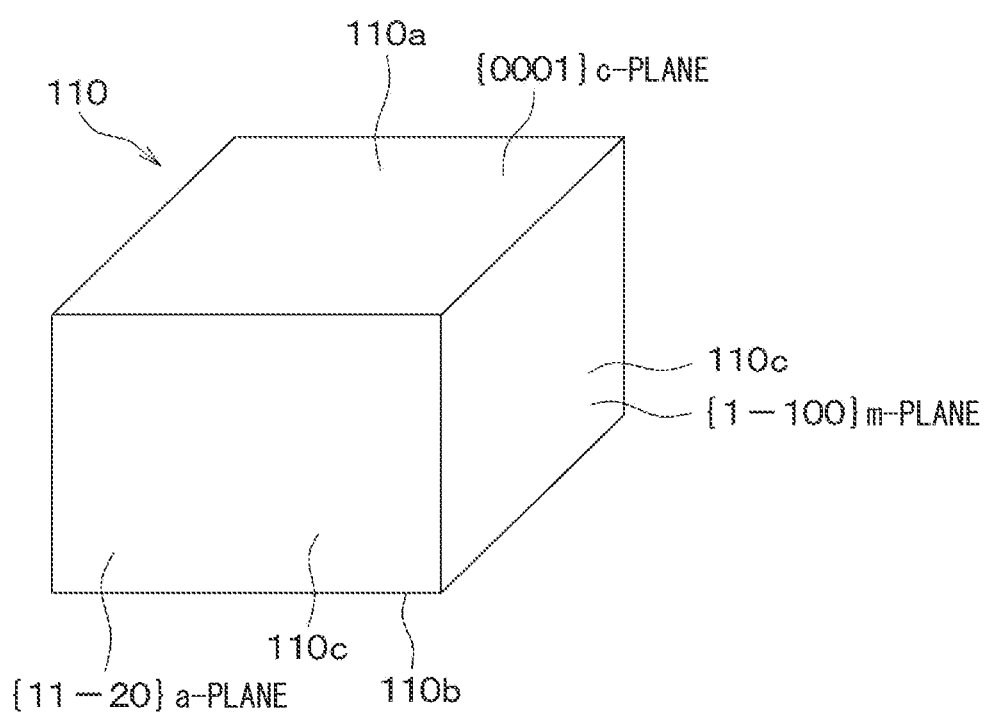
FIG. 4 is a schematic diagram of a chip-constituting substrate.

As described above, the cutting line SL extends along the {1-100} m-plane or the {11-20} a-plane. Therefore, one of the two pairs of opposing side surfaces 110c of the chip-constituting substrate 110 (that is, the semiconductor chip 100) is along the {1-100} m-plane, and the other is along the {11-20} a-plane. That is, as shown in FIG. 4, the one surface 110a and the other surface 110b of chip-constituting substrate 110 are along the {0001} c-plane. In addition, one of the two pairs of opposing side surfaces 110c is along the {1-100} m-plane, and the other of the two pairs of opposing side surfaces 110c is along the {11-20} a-plane.

The {1-100} m-plane and the {11-20} a-plane are orthogonal to the {0001} c-plane, which is the one surface 10a of the processed wafer 10, and are easily cleaved. Therefore, when each chip formation area RA is divided by the chip transformation layer 14 as a boundary, cracks extending inward from the side surface 110c and excessive strain in the side surface 110c can be suppressed.

After that, the adhesive force of the adhesive 22 is weakened by heat treatment or irradiation with light, and the semiconductor chip 100 is picked up. As a result, the semiconductor chip 100 is manufactured. Before dividing the chip formation areas RA, if necessary, a slit or the like may be formed at the boundary of each chip formation area RA in the metal film 61 so as to easily divide the metal film 61 for each chip formation area RA. In this case, in the step of FIG. 1H, a metal mask covering a portion to be divided may be prepared so that the metal film 61 is not formed on the to-be-divided portion.

Since the semiconductor chip 100 is manufactured by being divided at the chip transformation layer 14 as a boundary, the altered layer 120 composed of the chip transformation layer 14 remains on the side surface 110c as in a state in which minute unevenness is formed. Therefore, in the manufacturing method of the present embodiment, the semiconductor chip 100 that is easy to handle is manufactured.

The inventors further investigated the state of the side surface 110c and obtained the following results. First, as described above, the side surface 110c of the semiconductor chip 100 is the {1-100} m-plane or the {11-20} a-plane. Then, when the inventors of the present invention performed depth direction analysis using X-ray photoelectron spectroscopy (hereinafter also referred to as XPS) for the side surface 110c, the results shown in FIG. 5 were obtained.

Figure 5:
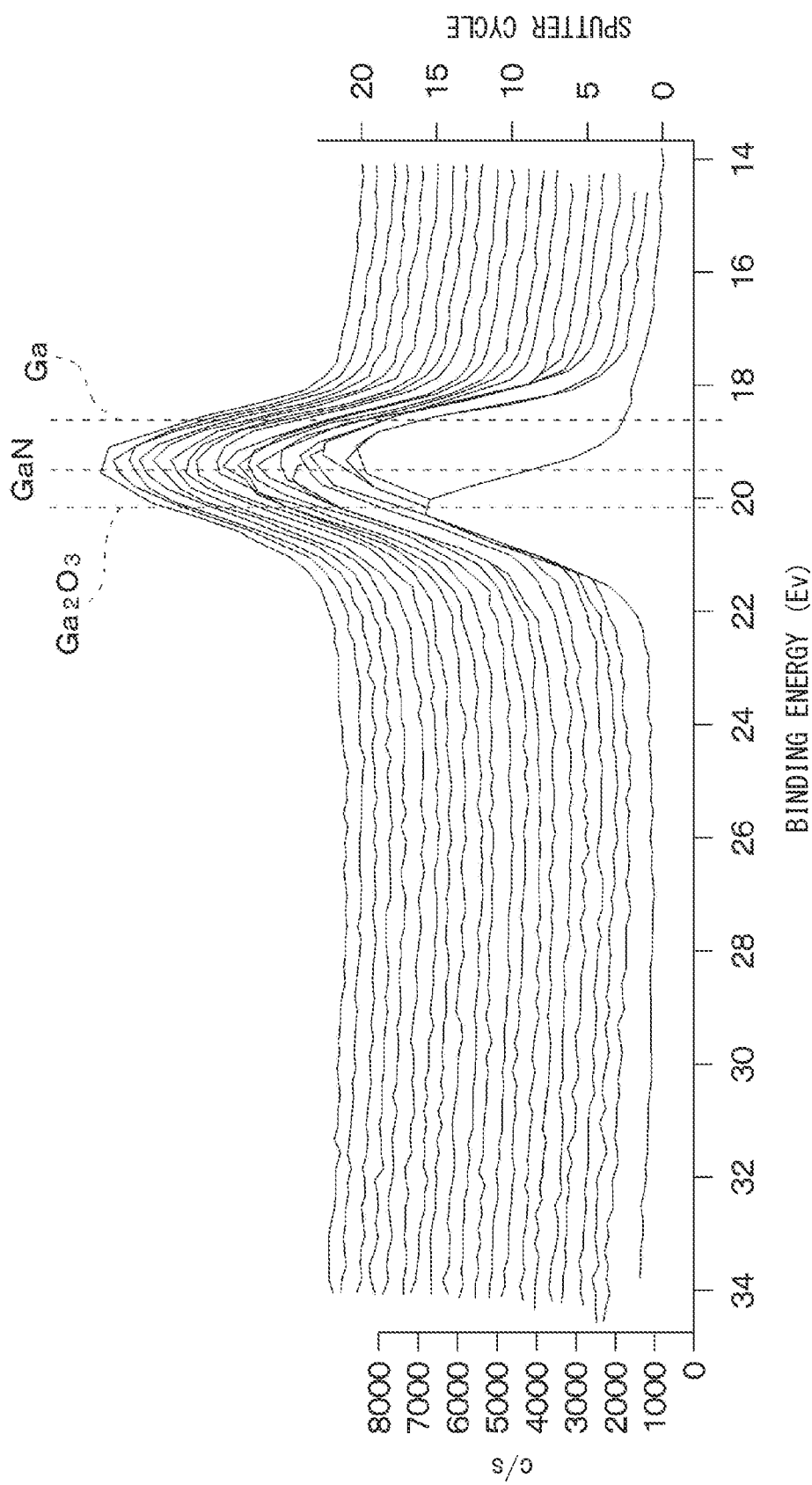
FIG. 5 is a diagram showing spectra obtained by X-ray photoelectron spectroscopy.

It should be noted that FIG. 5 shows the result of analysis in the depth direction using sputter etching with argon ions, and the sputter rate is set to 20 nm. In addition, FIG. 5 shows the result of performing XPS on the side surface 110c composed of the {11-20} a-plane with the normal direction to the side surface 110c as the depth direction (hereinafter also simply referred to as the depth direction). However, according to the studies of the present inventors, it has been confirmed that similar results can be obtained even if XPS is performed on the side surface 110c composed of the {1-100} m-plane. In addition, c/s in FIG. 5 indicates the number of counts of electrons per second.

As shown in FIG. 5, in the spectrum obtained when the number of times of sputtering (sputter cycle in FIG. 5) is 0, it is confirmed that $Ga_2O_3$ (that is, gallium oxide) and Ga metal are mixed. GaN is confirmed to be absent. More specifically, a quantitative analysis of the results of the 0th sputtering cycle in FIG. 5 confirms that 90% or more of $Ga_2O_3$ is present and less than 10% of Ga metal is present. In other words, the analysis result when the number of times of sputtering is 0 can be said to be the analysis result of the outermost layer portion of the side surface 110c.

In the spectrum obtained when the number of times of sputtering is 1 or more, only GaN is confirmed, and $Ga_2O_3$ and Ga metal are not confirmed.

From the above, it can be said that each side surface 110c has the altered layer 120 containing $Ga_2O_3$ and Ga metal formed on the surface layer in the depth direction. Also, as described above, FIG. 5 shows the results when the sputtering rate is set to 20 nm. Therefore, it can be said that the altered layer 120 exists only in a range of 20 nm or less from the side surface 110c in the depth direction. In other words, it can be said that the altered layer 120 exists only in a range of 20 nm or less from the side surface 110c in terms of the sputter rate of sputter etching using argon ions. In addition, as described above, the side surface 110c is in a state in which minute unevenness is formed. Therefore, the range of 20 nm or less along the depth direction here can also be said to be a range of an average depth of 20 nm or less.

Figure 1J:
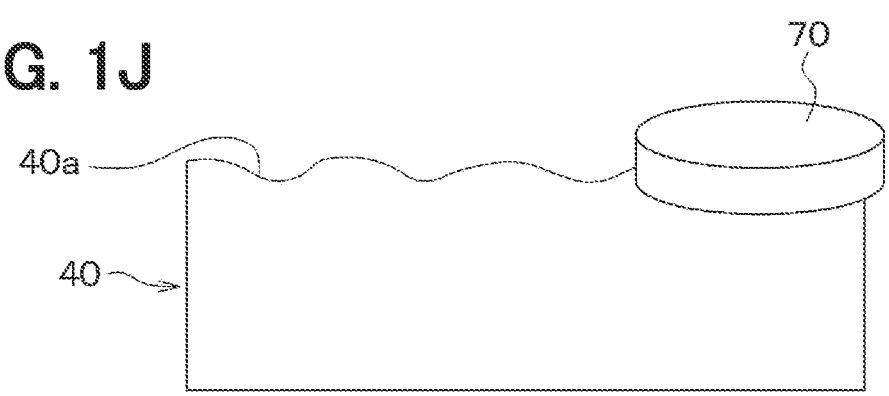
FIG. 1J is a cross-sectional view illustrating a manufacturing process of the semiconductor chip subsequent to FIG. 1I.

Further, as shown in FIG. 1J, the one surface 40a of the recycled wafer 40 configured in FIG. 1G is flattened by performing a CMP method using a polishing apparatus 70 or the like on the one surface 40a. Then, the flattened recycled wafer 40 is used as the GaN wafer 1, and the steps after FIG. 1A are performed again. As a result, the GaN wafer 1 can be used plural times to form the semiconductor chip 100.

According to the present embodiment, the one surface 110a and the other surface 110b of the semiconductor chip 100 are the {0001} c-plane, and the side surface 110c is the {1-100} m-plane or {11-20} a-plane. Therefore, when the processed wafer 10 is divided to each chip formation area RA, it is possible to suppress the generation of cracks extending inward in the side surface 110c and the generation of excessive strain in the side surface 110c.

Further, the surface layer portion of the side surface 110c is configured to include the altered layer 120 containing less than 10% Ga metal and 90% or more $Ga_2O_3$. That is, the side surface 110c is mainly composed of gallium oxide. Therefore, it is possible to improve the insulating property of the side surface 110c.

(1) In this embodiment, the altered layer 120 is formed in a range of 20 nm or less from the side surface 110c in the depth direction. Therefore, most of the semiconductor chip 100 can be formed as an element region.

(2) In this embodiment, the chip formation area RA is divided by expanding the holding member 20. Therefore, for example, the manufacturing process can be simplified as compared with the case where each chip formation area RA is divided by a dicing blade or the like.

(3) In the present embodiment, when forming the chip transformation layer 14 and the wafer transformation layer 15, they intersect each other. Further, when the wafer transformation layer 15 is formed, nitrogen generated when the wafer transformation layer 15 is formed is released via the chip transformation layer 14. Therefore, the distortion generated in each chip formation area RA can be reduced, and the occurrence of defects in the semiconductor chip 100 can be suppressed.

(4) In the present embodiment, the recycled wafer 40 is divided from the processed wafer 10 and the recycled wafer 40 is reused as the GaN wafer 1. Therefore, it is not necessary to newly prepare the GaN wafer 1 every time a semiconductor chip 100 is manufactured, and the GaN wafer 1 can be effectively used. Therefore, the productivity of the semiconductor chip 100 can be improved.

(5) In the present embodiment, when thinning the processed wafer 10, the laser beam L is irradiated to form the wafer transformation layer 15, and the recycled wafer 40 is divided at the wafer transformation layer 15 as a boundary. Therefore, the manufacturing time can be shortened as compared with the case where the thickness is reduced by grinding or the like from the other surface 10b of the processed wafer 10 by the CMP method or the like.

(6) In this embodiment, the side surface 110c of the semiconductor chip 100 is in a state in which fine irregularities are formed. Therefore, the handling of the semiconductor chip 100 can be facilitated.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various combinations and configurations, which are preferred, other combinations and configurations, including more, less or only a single element, are also within the spirit and scope of the present disclosure.

In the embodiment, while the one surface 110a, the other surface 110b, and the side surface 110c of the chip-constituting substrate 110 are either the {0001} c-plane, the {1-100} m-plane, or the {11-20} a-plane, the specific surface configuration can be changed as appropriate. For example, the one surface 110a and the other surface 110b may be {1-100} m-plane, and the side surface 110c may be {0001} c-plane or {11-20} a-plane. According to the studies of the present inventors, it has been confirmed that XPS results similar to those shown in FIG. 5 when the side surface 110c is {0001} c-plane.

Further, in the first embodiment, the processed wafer 10 may be composed only of a single crystal substrate. Further, the thickness of the processed wafer 10 may be adjusted by grinding on the other surface 10b before performing the process of FIG. 1E or after performing the process of FIG. 1E without performing the process of FIG. 1F.

In the first embodiment, the epitaxial film 3 may be made of only the n⁻ type epitaxial layer 3b.

Further, in the first embodiment, in the process of forming the epitaxial film 3 shown in FIG. 1B, an epitaxial film may be also formed on the second surface 1b of the GaN wafer 1. According to this, for example, even when the wafer transformation layer 15 is formed in the GaN wafer 1, it becomes easy to remain a thickness equal to or more than a predetermined thickness as the recycled wafer 40, and the number of times that the recycled wafer can be recycled can be increased.

Further, in the first embodiment, the step of forming the chip transformation layer 14 of FIG. 1E may be performed before the step of arranging the holding member 20 of FIG. 1D. In this case, the laser beam L may be irradiated from the one surface 10a of the processed wafer 10. When the laser beam L is irradiated from the one surface 10a of the processed wafer 10, the position of the condensing point of the laser beam L may vary depending on the surface electrode, the wiring pattern, or the like formed on the one surface 10a. Therefore, it may be preferable to irradiate the laser beam from the other surface 10b of the processed wafer 10.

What is claimed is:

1. A semiconductor chip comprising:
a chip-constituting substrate having one surface, the other surface opposite to the one surface, and two pairs of opposing side surfaces connecting the one surface and the other surface, the chip-constituting substrate containing a hexagonal gallium nitride,
wherein
the one surface and the other surface are along one of a {0001} c-plane, a {1-100} m-plane, and a {11-20} a-plane,
one of the two pairs of opposing side surfaces is along another one of the {0001} c-plane, the {1-100} m-plane, and the {11-20} a-plane,
the other of the two pairs of opposing side surfaces is along the other of the {0001} c-plane, the {1-100} m-plane, and the {11-20} a-plane,
the side surface includes an altered layer containing gallium oxide and gallium metal in a surface layer portion in a depth direction which is a normal direction to the side surface, and
the altered layer is formed in a range of 20 nm or less from the side surface in the depth direction.

2. A semiconductor chip comprising:
a chip-constituting substrate having one surface, the other surface opposite to the one surface, and two pairs of opposing side surfaces connecting the one surface and the other surface, the chip-constituting substrate containing a hexagonal gallium nitride,
wherein
the one surface and the other surface are along one of a {0001} c-plane, a {1-100} m-plane, and a {11-20} a-plane,
one of the two pairs of opposing side surfaces is along another one of the {0001} c-plane, the {1-100} m-plane, and the {11-20} a-plane,
the other of the two pairs of opposing side surfaces is along the other of the {0001} c-plane, the {1-100} m-plane, and the {11-20} a-plane, and
the side surface includes an altered layer containing gallium oxide and gallium metal in a surface layer portion in a depth direction which is a normal direction to the side surface,
the altered layer contains less than 10% of the gallium metal.

3. A method for manufacturing the semiconductor chip having a chip-constituting substrate having one surface, the other surface opposite to the one surface, and two pairs of opposing side surfaces connecting the one surface and the other surface, the chip-constituting substrate containing a hexagonal gallium nitride, wherein the one surface and the other surface are along one of a {0001} c-plane, a {1-100} m-plane, and a {11-20} a-plane, one of the two pairs of opposing side surfaces is along another one of the {0001} c-plane, the {1-100} m-plane, and the {11-20} a-plane, the other of the two pairs of opposing side surfaces is along the other of the {0001} c-plane, the {1-100} m-plane, and the {11-20} a-plane, and the side surface includes an altered layer containing gallium oxide and gallium metal in a surface layer portion in a depth direction which is a normal direction to the side surface, the method comprising:
preparing a processed wafer having one surface and the other surface and containing the hexagonal gallium nitride, the processed wafer having a plurality of chip formation areas defined by a cutting line;
irradiating the processed wafer with a laser beam to form a chip transformation layer in which nitrogen is separated from gallium along the cutting line; and
dividing the chip formation areas from each other with the chip transformation layer as a boundary, so as to form the chip-constituting substrate having the one surface composed of the one surface of the processed wafer, the other surface composed of the other surface of the processed wafer, and the two pairs of opposing side surfaces along the cutting line so as to connect the one surface and the other surface.

4. The method according to claim 3, further comprising:
disposing a holding member on the one surface of the processed wafer before forming the chip-constituting substrate; and
expanding the holding member to form the chip-constituting substrate in the dividing of the chip formation areas.

* * * * *